(12) United States Patent
Heaberlin (10) Patent No.: US 7,352,170 B2
(45) Date of Patent: Apr. 1, 2008

(54) EXHAUSTIVE DIAGNOSIS OF BRIDGING DEFECTS IN AN INTEGRATED CIRCUIT INCLUDING MULTIPLE NODES USING TEST VECTORS AND IDDQ MEASUREMENTS

(75) Inventor: Douglas C. Heaberlin, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 128 days.

(21) Appl. No.: 11/423,854

(22) Filed: Jun. 13, 2006

(65) Prior Publication Data

US 2007/0296443 A1  Dec. 27, 2007

(51) Int. Cl.
*G06F 17/50* (2006.01)
(52) U.S. Cl. .................... 324/158.1; 716/4
(58) Field of Classification Search ............ None
See application file for complete search history.

(56) References Cited

U.S. PATENT DOCUMENTS

| | | | |
|---|---|---|---|
| 5,581,563 A | 12/1996 | Penza et al. | |
| 5,963,046 A | 10/1999 | Konuk | |
| 6,127,838 A | 10/2000 | Sachdev | |
| 6,366,108 B2 | 4/2002 | O'Neill et al. | |
| 6,449,751 B1* | 9/2002 | Hussain et al. | 716/4 |
| 6,677,774 B2 | 1/2004 | Buffet et al. | |
| 6,694,495 B1* | 2/2004 | Hussain et al. | 716/4 |
| 6,812,724 B2 | 11/2004 | Rao et al. | |
| 6,941,235 B2 | 9/2005 | Gattiker | |
| 6,975,978 B1 | 12/2005 | Ishida et al. | |
| 7,043,389 B2* | 5/2006 | Plusquellic | 702/117 |
| 2005/0125711 A1 | 6/2005 | Gattiker et al. | |
| 2006/0028199 A1 | 2/2006 | Hatamian | |

OTHER PUBLICATIONS

"Efficient Diagnosis of Single/Double Bridging Faults with Delta Iddq Probabilistic Signatures and Viterbi Algorithm" by C. Thibeault, Dept. of Electrical Engineering, Canada. Year 2000.*
"AL Logic Fault Diagnosis Tool and Its Applicans" by Venkataraman et al. Intel Corporation, CA USA. Year 2000.*
Chakravarty et al., "*IDDQ* Measurement Based Diagnosis of Bridging Faults in Full Scan Circuits," 7th International Conference on VLSI Design, Jan. 1994, pp. 179-182, doc. not submitted, not consider.

* cited by examiner

*Primary Examiner*—Paresh Patel
(74) *Attorney, Agent, or Firm*—Ryan K. Simmons; Hoffman, Warnick & D'Alessandro LLC (57) ABSTRACT

A method, system and computer program product for diagnosing a bridging defect in an integrated circuit including multiple nodes are disclosed. Quiescent power supply current ($I_{DDQ}$) of the integrated circuit (IC) is measured under multiple test vectors. Logic states of the nodes on the IC are also obtained under the multiple test vectors. The nodes are partitioned into sets based on their logic states under low-current test vectors. Large sets are further divided into subsets ("state-count subsets") based on the logic states of nodes under high-current test vectors. For large sets, explicit evaluation under the $I_{DDQ}$ bridge fault model is performed only on pairs of nodes belonging to subsets having complementary state counts, to save system resources in computation. Exhaustive diagnosis considering all pairs of nodes on the IC is thus feasibly achieved due to the saving of system resources.

28 Claims, 8 Drawing Sheets

| Test Vector | 1 | 2 | 3 | 4 | 5 | ...... | n |
|---|---|---|---|---|---|---|---|
| $I_{DDQ}$ | $I_1$ | $I_2$ | $I_3$ | $I_4$ | $I_5$ | ...... | $I_n$ |
| Node A | 1 | 0 | 1 | 0 | 1 | ...... | 0 |
| Node B | 1 | 0 | 1 | 0 | 1 | ...... | 1 |

FIG. 5

| Test Vector | 1 | 2 | 3 | 4 | 5 | ...... | n |
|---|---|---|---|---|---|---|---|
| $I_{DDQ}$ | H | L | H | L | H | ...... | L |
| Node A | 1 | 0 | 1 | 0 | 1 | ...... | 0 |
| Node B | 1 | 0 | 1 | 0 | 1 | ...... | 1 |

EXHAUSTIVE DIAGNOSIS OF BRIDGING DEFECTS IN AN INTEGRATED CIRCUIT INCLUDING MULTIPLE NODES USING TEST VECTORS AND IDDQ MEASUREMENTS

FIELD OF THE INVENTION

The invention relates generally to diagnosing faults in an integrated circuit, and more particularly to diagnosing a bridging defect in an integrated circuit.

BACKGROUND OF THE INVENTION

The logical and electrical behavior of a bridging defect, an unintended electrical connection or "short" between nodes in an integrated circuit (IC) design, has long been a subject of research within the test community. Bridging defects are a prime cause of IC manufacturing yield loss, and reducing their number thus has significant financial benefit for an IC manufacturer. Bridging defects, especially high-resistance bridges, may also escape detection during manufacturing test. An IC with an undetected bridge may thus erroneously be shipped to a customer, where it may fail immediately or after an extended period of use.

In no field is the ability to anticipate and accommodate the varied behaviors of bridging defects more central to success than in fault diagnosis, the goal of which is to determine the physical location of a defect. In light of the complexity and expense of modeling all of the known scenarios and physical factors that affect bridge behavior, much creative work has been done to find ways to diagnose bridging defects using simple logical fault models. The logical behavior caused by a short between two or more nodes, however, depends on such physical details as the relative drive strengths of the transistors driving the bridged nodes, the input logic thresholds of gates downstream of the bridge, and the resistance of the bridge itself. The possibility of a bridge introducing a feedback path into a circuit, or of exhibiting "Byzantine Generals" behavior (in which not all of the logic gates downstream of the defect site interpret the degraded voltage levels on their input as the same logic value) illustrates the difficulty of capturing the complexities of bridging defects with simple logical models. For these reasons, diagnostic methods that rely on logical fault models must tolerate defective circuit behavior that is not anticipated by the models. This tolerance can lead to less precise diagnosis or to diagnosis of the wrong defect.

As an alternative to logical fault models, the quiescent power supply current ($I_{DDQ}$) bridge fault model has been used to diagnose bridging defects. The $I_{DDQ}$ bridge fault model avoids the problems inherent in predicting the logical behavior of a bridge by ignoring logical behavior entirely. Instead, the model predicts only the circumstances under which an IC, while in a quiescent state, will draw additional current ("defect current") due to the presence of a bridging defect. For a typical complementary metal oxide semiconductor (CMOS) integrated circuit (IC) in a standby or quiescent state, $I_{DDQ}$ includes mainly leakage/background current. A bridging defect between two nodes may significantly elevate the $I_{DDQ}$ so that the value of the $I_{DDQ}$ may indicate whether a bridging defect exists. Diagnostic methods based on the $I_{DDQ}$ bridge fault model reconcile an observed $I_{DDQ}$ value with the logic states of two nodes to determine whether the two nodes are bridged.

A fundamental issue for diagnostic methods using the $I_{DDQ}$ bridge fault model is the set of candidate bridging faults considered during a diagnosis. Even a relatively small IC containing, e.g., a million circuit nodes has more than half a trillion pairs of nodes, any one of which could in theory be connected by a bridging defect. Consideration of all such pairs of nodes (exhaustive two-node bridge diagnosis) has typically been considered computationally intractable for large industrial designs.

As such, an attribute common to most $I_{DDQ}$-based bridge diagnostic methods is the reliance on a set of so-called "realistic" bridging faults. A set of realistic bridges is determined prior to a diagnosis by an examination of the physical layout, e.g., layout extraction. The object of the physical examination is to identify pairs of nodes whose physical proximity renders them more likely to be connected by a bridging defect. Layout extraction typically produces a list of candidate bridge faults whose number is a small fraction of all possible two-node bridges. Thus, the consideration of only realistic bridges significantly reduces the CPU resources required for diagnosis.

Unfortunately, at least two factors limit the applicability of any diagnostic method that relies on a set of realistic bridges. First is the expense of extracting and storing the realistic bridges. Layout extraction is typically expensive in terms of CPU resources. This expense is acceptable on a one-time basis for an IC design produced in a high volume, for which one would like to run many diagnoses. However, for an IC manufacturer that fabricates hundreds of different ASIC designs every year, layout extraction clearly becomes an onerous prerequisite for diagnosis.

However, a more significant disadvantage of limiting diagnosis to a set of realistic faults is that the rules used during layout extraction to determine which bridges are "realistic" are based on assumptions that may not always be valid. In order to reduce run time and storage space, for example, a layout extraction will typically identify only bridges between nodes that lie within the same process layer, even though the occurrence of vertical bridges connecting nodes in different process layers is well documented. In general, the capacity of a semiconductor manufacturing line to produce bridging defects that are "unexpected" is significant. The ability to diagnose bridging defects that one does not know in advance to expect is an advantage that cannot be realized by methods that consider only realistic bridges.

Chakravarty and Suresh, $I_{DDQ}$ *Measurement Based Diagnosis of Bridging Faults in Full Scan Circuits*, 7th International Conference on VLSI Design (January 1994), propose a method for performing exhaustive two-node bridging fault diagnosis using $I_{DDQ}$. Chakravarty and Suresh rely on an implicit representation of all possible two-node bridges using a "set of ordered pairs of sets (SOPS)." The amount of memory required for this method, however, can increase exponentially and potentially exceed the capacity of a computer as each test vector is considered and each SOPS is subdivided. In addition, results for the Chakravarty and Suresh method were published only for a set of small benchmark circuits, and even these results include a test case that requires almost an hour of CPU time. The application of the Chakravarty and Suresh method is thus not a feasible alternative for even moderately-sized industrial circuits, whose sizes exceed that of the benchmark circuits by 100 times or more.

Based on the above, there is a need in the art for a diagnostic method that can consider bridging defects between all pairs of nodes in an IC chip in an efficient way. The present state of the art technology does not provide a satisfactory solution to this need. The current invention resolves, among others, this problem.

SUMMARY OF THE INVENTION

A method, system and computer program product for diagnosing a bridging defect in an integrated circuit including multiple nodes are disclosed. Quiescent power supply current ($I_{DDQ}$) of the integrated circuit (IC) is measured under multiple test vectors. Logic states of the nodes on the IC are also obtained under the multiple test vectors. The nodes are partitioned into sets based on their logic states under low-current test vectors. Large sets are further divided into subsets ("state-count subsets") based on the logic states of nodes under high-current test vectors. For large sets, explicit evaluation under the $I_{DDQ}$ bridge fault model is performed only on pairs of nodes belonging to subsets having complementary state counts, to save system resources in computation. Exhaustive diagnosis considering all pairs of nodes on the IC is thus feasibly achieved due to the saving of system resources.

A first aspect of the invention is directed to a method for diagnosing a bridging defect in an integrated circuit including multiple nodes, the method comprising: obtaining quiescent power supply current ($I_{DDQ}$) measurements of the integrated circuit under multiple test vectors; categorizing each of the obtained $I_{DDQ}$ measurements as one of a defect value and a non-defect value; obtaining a logic state of each of the multiple nodes under each of the multiple test vectors; determining whether two of the multiple nodes constitute a complementary pair of nodes; and diagnosing whether a bridging defect exists between the determined complementary pair of nodes.

A second aspect of the invention is directed to a system for diagnosing a bridging defect in an integrated circuit including multiple nodes, the system comprising: means for measuring quiescent power supply current ($I_{DDQ}$) of the integrated circuit under multiple test vectors; means for categorizing each of the obtained $I_{DDQ}$ measurements as one of a defect value and a non-defect value; means for obtaining a logic state of each of the multiple nodes under each of the multiple test vectors; means for determining whether two of the multiple nodes constitute a complementary pair of nodes; and means for diagnosing whether a bridging defect exists between the determined complementary pair of nodes.

A third aspect of the invention is directed to a computer program product for diagnosing a bridging defect in an integrated circuit including multiple nodes, the computer program product comprising: computer usable program code configured to: obtain quiescent power supply current ($I_{DDQ}$) measurements of the integrated circuit under multiple test vectors; categorize each of the obtained $I_{DDQ}$ measurements as one of a defect value and a non-defect value; obtain a logic state of each of the multiple nodes under each of the multiple test vectors; determine whether two of the multiple nodes constitute a complementary pair of nodes; and diagnose whether a bridging defect exists between the determined complementary pair of nodes.

A fourth aspect of the invention is directed to a method of generating a system for diagnosing a bridging defect in an integrated circuit including multiple nodes, the method comprising: providing a computer infrastructure operable to: obtain quiescent power supply current ($I_{DDQ}$) measurements of the integrated circuit under multiple test vectors; categorize each of the obtained $I_{DDQ}$ measurements as one of a defect value and a non-defect value; obtain a logic state of each of the multiple nodes under each of the multiple test vectors; determine whether two of the multiple nodes constitute a complementary pair of nodes; and diagnose whether a bridging defect exists between the determined complementary pair of nodes.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

The embodiments of this invention will be described in detail, with reference to the following figures, wherein like designations denote like elements, and wherein.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION OF THE INVENTION

The following detailed description of embodiments refers to the accompanying drawings, which illustrate specific embodiments of the invention. Other embodiments having different structures and operations do not depart from the scope of the present invention.

1. System Overview

Figure 1:
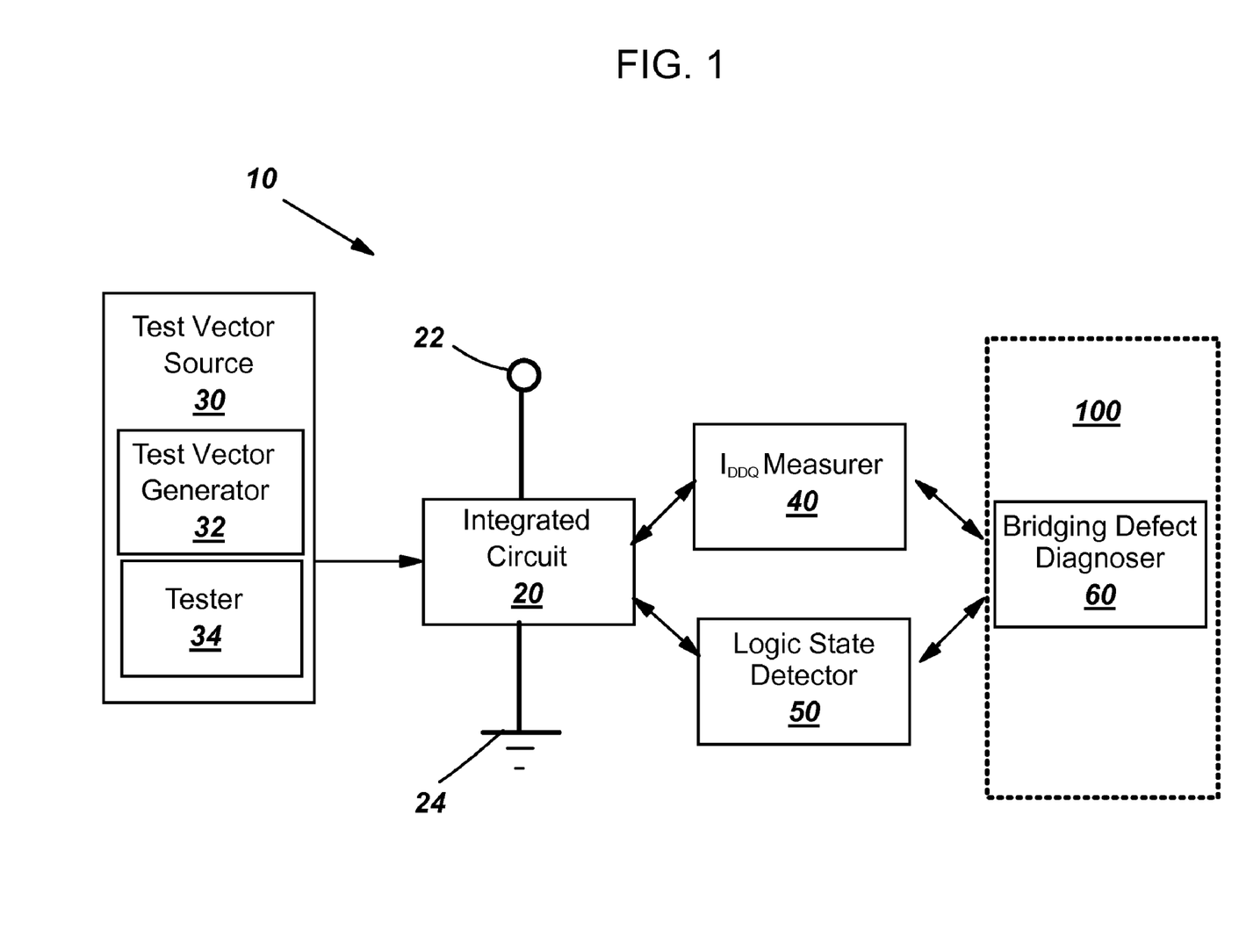
FIG. 1 shows a schematic view of a bridging defect diagnosis system according to one embodiment of the invention.

Referring to FIG. 1, a schematic view of an illustrative bridging defect diagnosis system (diagnosis system) 10 is shown. According to one embodiment, diagnosis system 10 includes an integrated circuit (IC) 20 that includes multiple nodes as should be appreciated; a test vector source 30 including a test vector generator 32 and a tester 34; an $I_{DDQ}$ measurer 40; a logic state detector 50; and a bridging defect diagnoser 60. Integrated circuit (IC) 20 may be coupled between a positive power supply (VDD) 22 and a ground 24. In operation, test vector generator 32 generates test vectors and tester 34 inputs the generated test vectors into IC 20, which drives/sets the nodes on IC 20 to different logic states. Under each test vector, $I_{DDQ}$ measurer 40 measures an $I_{DDQ}$ of IC 20, and logic state detector 50 detects/obtains logic states of the nodes on IC 20. The measured $I_{DDQ}$ and the obtained logic states may be fed into bridging defect diagnoser 60 to process.

It should be appreciated that logic states of the nodes on IC 20 are not limited to states "0" and "1". For example, in a transistor or switch-level representation of IC 20, certain nodes under some test vectors will be electrically isolated from both Vdd 22 and GND 24, i.e., "floating". Also, the logic state of some nodes may not be known on all vectors (these unknown states are usually referred to in a simulation as logic "X" states). All these situations are within the scope of the current invention. In the following description, however, node logic states "1" and "0" under the test vectors are used as an example, for illustrative purposes.

It should be appreciated that components of diagnosis system 10 may be located on separate physical locations or on a single physical location. In addition, components of diagnosis system 10 may be implemented as real mechanisms or may be implemented by simulations. For example, test vector generator 32 may be automatic test pattern generation (ATPG) software stored and implemented in a computer system, and tester 34 may be a hardware-based device, e.g., automated test equipment (ATE). Tester 34 may also be a physical mechanism that feeds test patterns designed by an IC designer to IC 20. In addition, the logic state of the nodes of IC 20 may be actually measured under the generated test vectors, or may be simulated under the test vectors using the IC design data, e.g., an algorithmic description of the IC design. It should be appreciated that all possible embodiments of implementing diagnosis system 10 are included in the current invention According to one embodiment, bridging defect diagnoser 60 may be implemented by a computer software product stored in a computer system 100. Details of computer system 100 will be described below.

2. Computer System

Figure 2:
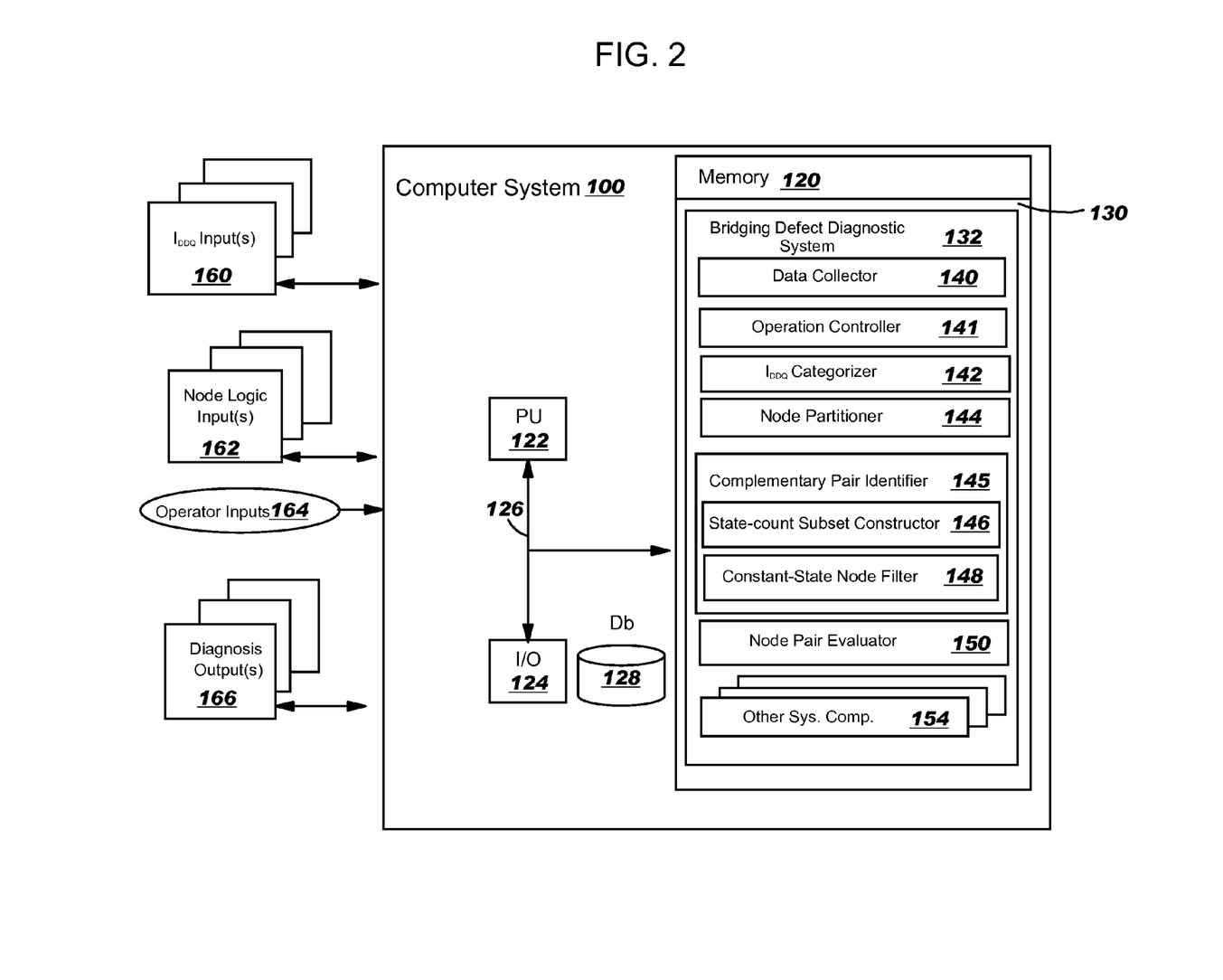
FIG. 2 shows a block diagram of an illustrative computer system according to one embodiment of the invention

Referring to FIG. 2, a block diagram of an illustrative computer system 100 according to one embodiment of the invention is shown. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 2, program product 130 may include a bridging defect diagnostic system 132 which may implement bridging defect diagnoser 60 of FIG. 1. Bridging defect diagnostic system 132 may include a data collector 140; an operation controller 141; an $I_{DDQ}$ categorizer 142; a node partitioner 144; a complementary pair identifier 145 including a state-count subset constructor 146 and a constant-state node filter 148; a node pair evaluator 150; and other system components 154. Other system components 154 may include any now known or later developed parts of a computer system 100 not individually delineated herein, but understood by those skilled in the art.

Inputs to computer system 100 include $I_{DDQ}$ inputs 160, node logic inputs 162 and operator inputs 164. $I_{DDQ}$ inputs 160 may include the data collected by $I_{DDQ}$ measurer 40 (FIG. 1). Node logic inputs 162 may include the data collected by logic state detector 50 (FIG. 1). Operator inputs 164 may include instructions of an operator of computer system 100 regarding the operation of, inter alia, bridging defect diagnostic system 132. For example, an operator may instruct $I_{DDQ}$ categorizer 142 regarding a threshold to divide/categorize the obtained $I_{DDQ}$ (from, e.g., $I_{DDQ}$ inputs 160), as will be described later. Those inputs may be communicated to computer system 100 through I/O 124 and may be stored in database 128. In the operation of bridging defect diagnostic system 132, the input data may be collected by data collector 140. Outputs of computer system 100 include diagnosis outputs 166 that are communicated to, inter alia, a user or a customer who pays for the service to act accordingly. For example, if a bridging defect has been found in an IC design, an IC designer may modify the IC manufacturing process or develop a method to cure the bridging defect. The operation of bridging defect diagnostic system 132 will be described in details below.

3. Bridging Defect Diagnostic System

Figure 3:
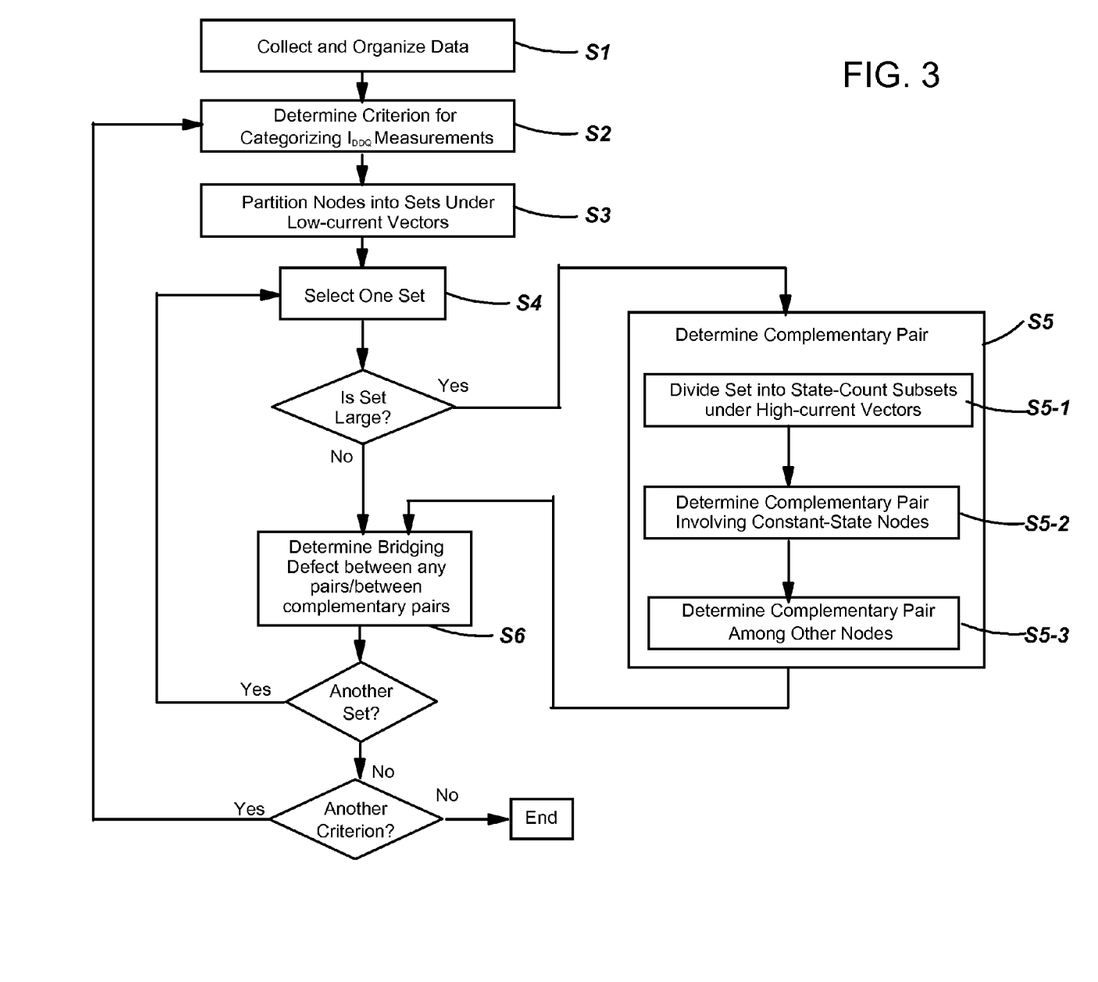
FIG. 3 shows a flow diagram of the operation of a bridging defect diagnostic system according to one embodiment of the invention.
Figure 4:
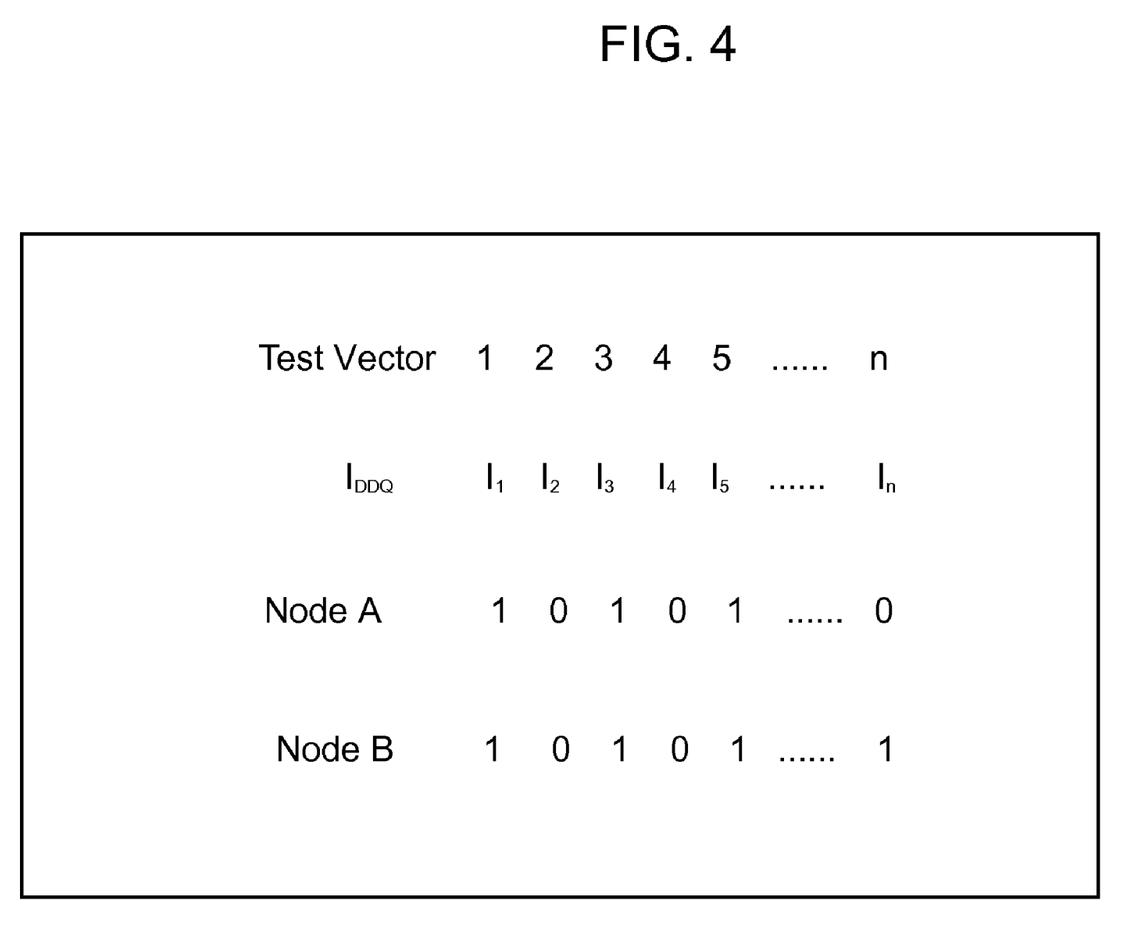
FIG. 4 shows an illustrative example of a table of data of quiescent power supply currents and logic states of nodes of an integrated circuit under various test vectors according to one embodiment of the invention.

Bridging defect diagnostic system 132 functions generally to diagnose whether a bridging defect exists between two nodes on an IC chip. The diagnosis is based on the data collected by $I_{DDQ}$ measurer 40 and node logic state detector 50 (FIG. 1). FIG. 3 shows one embodiment of the operation of bridging defect diagnostic system 132. Referring now to FIGS. 2-3, first in step S1, data collector 140 collects and organizes data to facilitate a further analysis of the data. The data collected includes $I_{DDQ}$ inputs 160, node logic inputs 162 and operator inputs 164. After collecting the data, data collector 140 organizes the data to facilitate further analysis as will be described later. Any now available or future developed methods of organizing the data may be used and all are included in the current invention. For example, the data of $I_{DDQ}$ and logic states of nodes under various test vectors may be arranged in a table as shown in FIG. 4. As shown in FIG. 4, $I_{DDQ}$ value ($I_n$) and logic states of nodes (two nodes A and B are shown) under a specific test vector are listed in a column, which facilitates analysis of relationships between and among nodes under a test vector and the related $I_{DDQ}$ measurement. In addition, data collector 140 may filter out data of some test vectors in order, for example, to focus analysis on the cause of a particular current level if several are indicated by the data, or simply to exclude data that may be difficult to categorize accurately in step S2.

Figure 5:
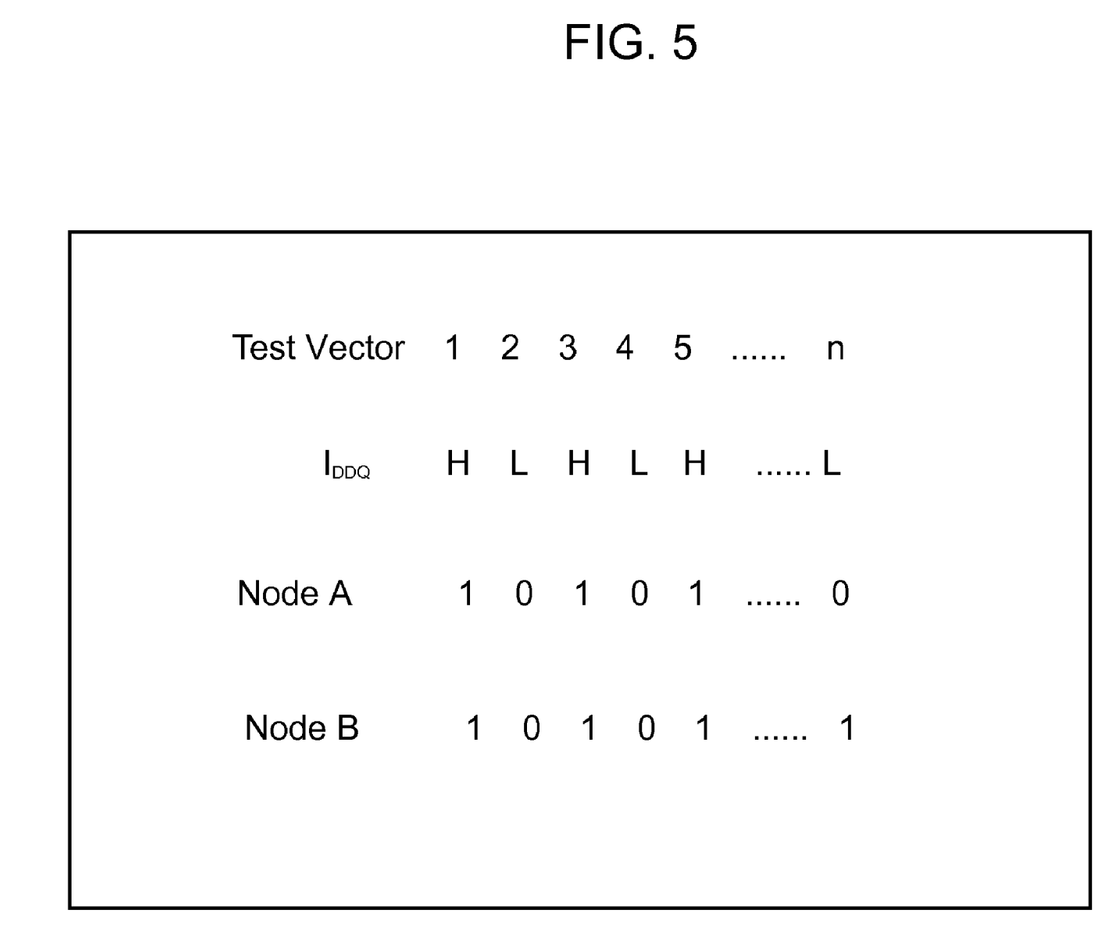
FIG. 5 shows the table of data of FIG. 4 with categorized $I_{DDQ}$ according to one embodiment of the invention.

Next in step S2, $I_{DDQ}$ categorizer 142 determines a criterion to categorize each of the obtained $I_{DDQ}$ measurements of IC 20 (FIG. 1) as one of a defect value and a non-defect value. Generally, whenever two bridged nodes are driven to opposite logic states, a defect current will flow, which contributes to the measured $I_{DDQ}$. As such, a defect value (of $I_{DDQ}$) will be used to refer to a value of $I_{DDQ}$ measured that potentially includes the contribution of defect currents; and a non-defect value will be used to refer to a value of $I_{DDQ}$ measured that does not include the contribution of defect currents. In addition, a test vector that generates a defect value of $I_{DDQ}$ will be referred to as a high-current vector; and a test vector that generates a non-defect value of $I_{DDQ}$ will be referred to as a low-current vector. It should be appreciated that the terms "high-current vector" and "low-current vector" are used for convenience and illustrative purposes, and do not necessarily imply, for example, that the actual value of $I_{DDQ}$ measured on a given vector designated as a "high-current vector" is necessarily higher than that measured on a given "low-current vector." It should also be appreciated that any now available and later developed methods/standards of distinguishing "high-current" and "low-current" vectors may be used by $I_{DDQ}$ categorizer 142, and all are included in the current invention. For example, a current signature of the measured $I_{DDQ}$ may be generated, which orders the values of the measured $I_{DDQ}$ from the smallest to the largest. If there is a jump in a plot of the current signature, a value of $I_{DDQ}$ around the point of jump may be chosen as a threshold for distinguishing high-current and low-current vectors. For another example, the "high-current" value may be within a range of measured $I_{DDQ}$, and vectors having $I_{DDQ}$ values beyond this range (higher or lower) may be considered low-current vectors. FIG. 5 shows a table of data with categorized $I_{DDQ}$, wherein the designations "H" and "L" represent high-current and low-current vectors, respectively. In the following description (including FIG. 5), it is assumed that $I_{DDQ}$ categorizer 142 determines a threshold with which to divide $I_{DDQ}$ measurements into high-current vectors (on which the defect is "active" and contributing defect current to the overall $I_{DDQ}$), and low-current vectors (on which the defect is "inactive" and causing the IC to draw no additional current).

As described above, it may not be easy to determine a criterion by which to categorize the obtained $I_{DDQ}$. To accommodate this problem, according to one embodiment, the process of categorizing the measured $I_{DDQ}$ and analyzing, among others, the categorized $I_{DDQ}$ may be iterated based on different standards/criteria for categorizing $I_{DDQ}$ values. As should be appreciated, different categorizations of $I_{DDQ}$ values may bring about different outcomes of the bridging defect diagnosis. These different outcomes may all be used in a further examination of the IC to diagnose bridging defects, e.g., physical evaluation. The total number of iterations may be determined by a user through examining, e.g., the $I_{DDQ}$ signature plot, or may be determined based on the system resources allocated to a specific diagnosing task of an IC. Details of the iteration will be described further later.

Next in step S3, node partitioner 144 partitions the nodes on the IC into sets based on the logic states of the nodes under low-current vectors. Specifically, node partitioner 144 determines whether two of the nodes were at the same logic state for a (preferably all) low-current vector. If not, the two nodes will be put into distinct sets. One purpose/utility of the partitioning is to split a large group of nodes into multiple smaller groups (sets) of nodes that require less time to process than the original large group. The underlying basis for the partitioning is that if a bridging defect exists between a node at logic "1" and another node at logic "0", the bridge will elevate the measured $I_{DDQ}$ to a defect value, e.g., high current. As such, if under a low-current vector, two nodes are in different logic states, the two nodes are not bridged. In other words, only nodes that are at the same logic state under low-current vectors are probable to have bridges among and between them. As such, under a low-current vector, the nodes on an IC will be partitioned into two sets based on their logic states.

Figure 6:
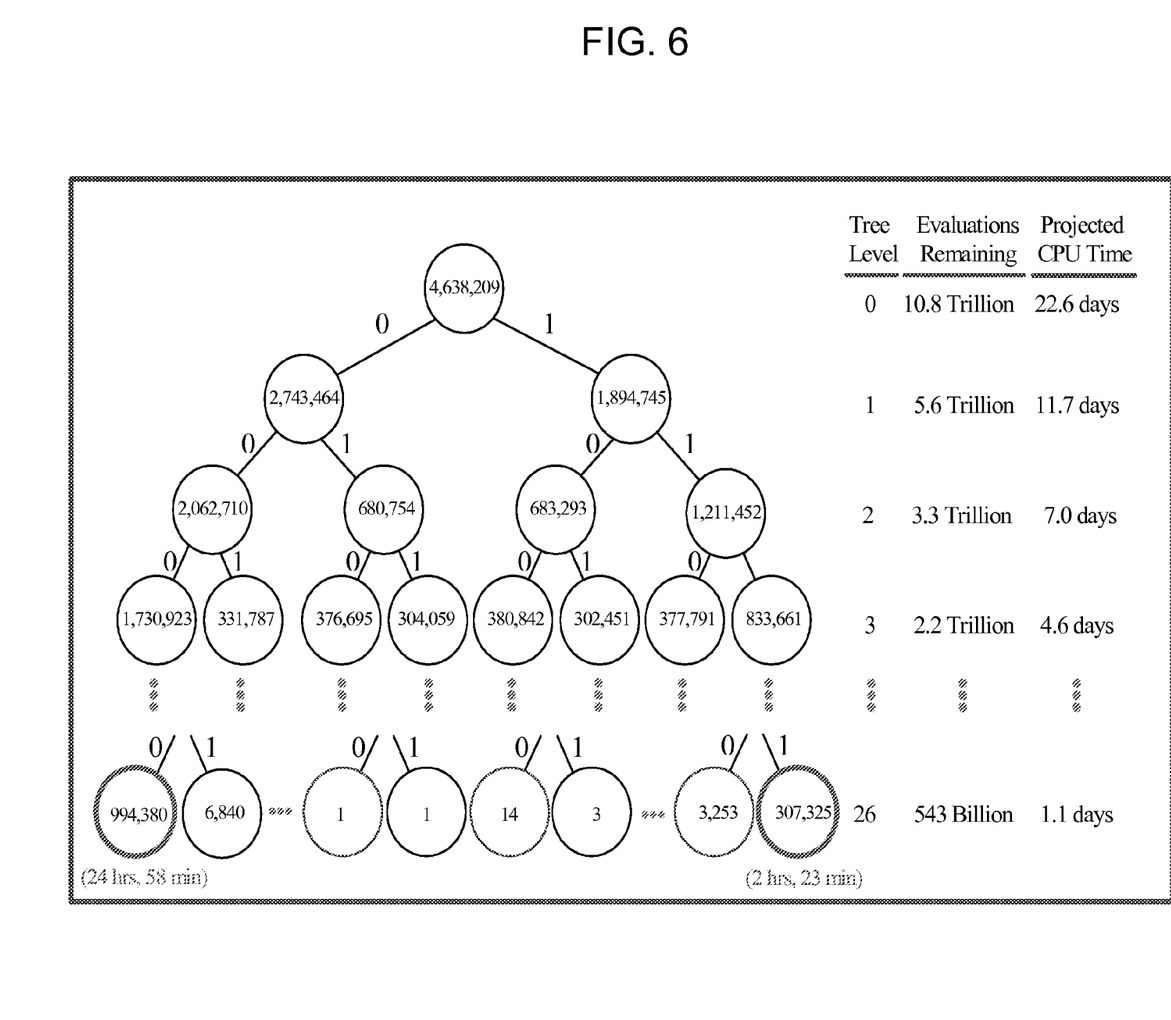
FIG. 6 shows an illustrative example of a binary tree of sets of nodes under low-current vectors according to one embodiment of the invention.

Using other low-current vectors, this partitioning operation may be applied recursively to each set that was created based on the node logic states under a prior low-current vector. This process may construct a binary tree whose height is the number of low-current vectors considered. Upon completion of this process, the nodes in the circuit may be partitioned into many sets (the leaves of the tree). A node in one set cannot be bridged to a node in another set. As a consequence, this partitioning operation reduces the amount of system resources required to diagnose bridging defects. FIG. 6 shows an illustrative example of a binary tree of sets of nodes under low-current vectors.

In the specific example shown in FIG. 6, each circle represents a set of nodes, and the number within each circle the number of nodes in that set. The column of values labeled "Evaluations Remaining" indicates the number of pairs of nodes that must still be considered as potentially bridged after the nodes have been partitioned into the sets shown immediately to the left; the values under "Projected CPU Time" indicate the time that would be required to explicitly evaluate the pairs of nodes at a rate of 5.5 million node pairs per second. As shown, the CPU processing time is substantially reduced by the partitioning process. According to one embodiment, further operation of bridging defect diagnostic system 132 will be performed only within each set in the bottom of the binary tree. For example, regarding the binary tree of FIG. 6, further analysis will only be performed within each set of tree level 26.

It should be appreciated that although step S3 is a preferable step, it is not necessary. Subsequent steps in FIG. 3 may be performed without first completing step S3. In addition, the partitioning operation of step S3 may not necessarily be performed for all low-current vectors, and may be performed for any number of low-current vectors, which are all included in the current invention.

Next, in step S4, operation controller 141 selects one of the sets created in step S3 for further analysis. If the set contains relatively few nodes, e.g., fewer than a preset threshold, e.g., any of the sets shown at level 26 of the binary tree in FIG. 6 that contain 14 or fewer nodes, operation controller 141 may skip step S5 and direct the analysis of the set of nodes to step S6, where node pair evaluator 150 diagnoses whether a bridging defect exists between two nodes within the set by determining whether logic states of the two nodes are opposite to each other under each of the test vectors that yield $I_{DDQ}$ measurements of defect value. If the set is large, however, operation controller 141 directs the process to the next step S5.

In step S5, complementary pair identifier 145 determines whether two of the nodes in a set constitute a complementary pair of nodes. Two nodes constitute a complementary pair if regarding all high-current vectors considered, the number of logic states "1" of one node equals the number of logic states "0" of the other node. Step S5 may include sub-steps S5-1 to S5-3. Please note that step S5 may be conducted with respect to any number of high-current vectors considered, and all are included in the current invention. In the following description, consideration of all high-current vectors is used as an illustrative example, which does not limit the scope of the current invention.

In step S5-1 state-count subset constructor 146 divides the set into subsets based on the number of high-current vectors on which each node was driven to logical '0' versus logical '1'. The state-count construction operation is based on the observation that a bridge between two nodes can produce an elevated $I_{DDQ}$ value only if the logic states of the two nodes are opposite to each other. That is, under all high-current vectors, whenever one node is at logical "0", the other must be at logical "1". This implies that if there are in total i high-current vectors, and node A is at logic "0" on j of the i high current vectors, node B needs to be considered as a potential bridge partner to node A only if node B is at logic "1" on j high current vectors, which is referred to as a "complementary state count." As such, node A and node B constitute a complementary pair of nodes. Please note that only the number of vectors on which a node is driven to each logic state is considered during state-count subset construction, and not the particular vectors on which a given node was driven to a particular state. Thus in general, determining that two nodes are respectively members of subsets with "complementary" state counts is not sufficient to conclude that the two nodes are bridged; the one-to-one correspondence of logic states under each vector must still be considered. However, the state-count set construction operation quickly eliminates from consideration many node pairs that cannot possibly match the $I_{DDQ}$ bridge fault model.

A special case of state-count processing may occur with respect to constant state nodes. A constant state node refers to a node that is at one logical state for all high-current vectors. In this case, it may be immediately observed that any constant logic '0' node must necessarily satisfy the requirements of the $I_{DDQ}$ bridge fault model when paired with a node of constant logic '1'. Thus, according to one embodiment, in step S5-2, which is optional, constant-state node filter 148 considers nodes in the "constant state" subsets, and immediately reports any pairs that match the $I_{DDQ}$ bridge fault model without additional analysis, and/or filters out a constant state subset if there is no complementary one.

Figure 7:
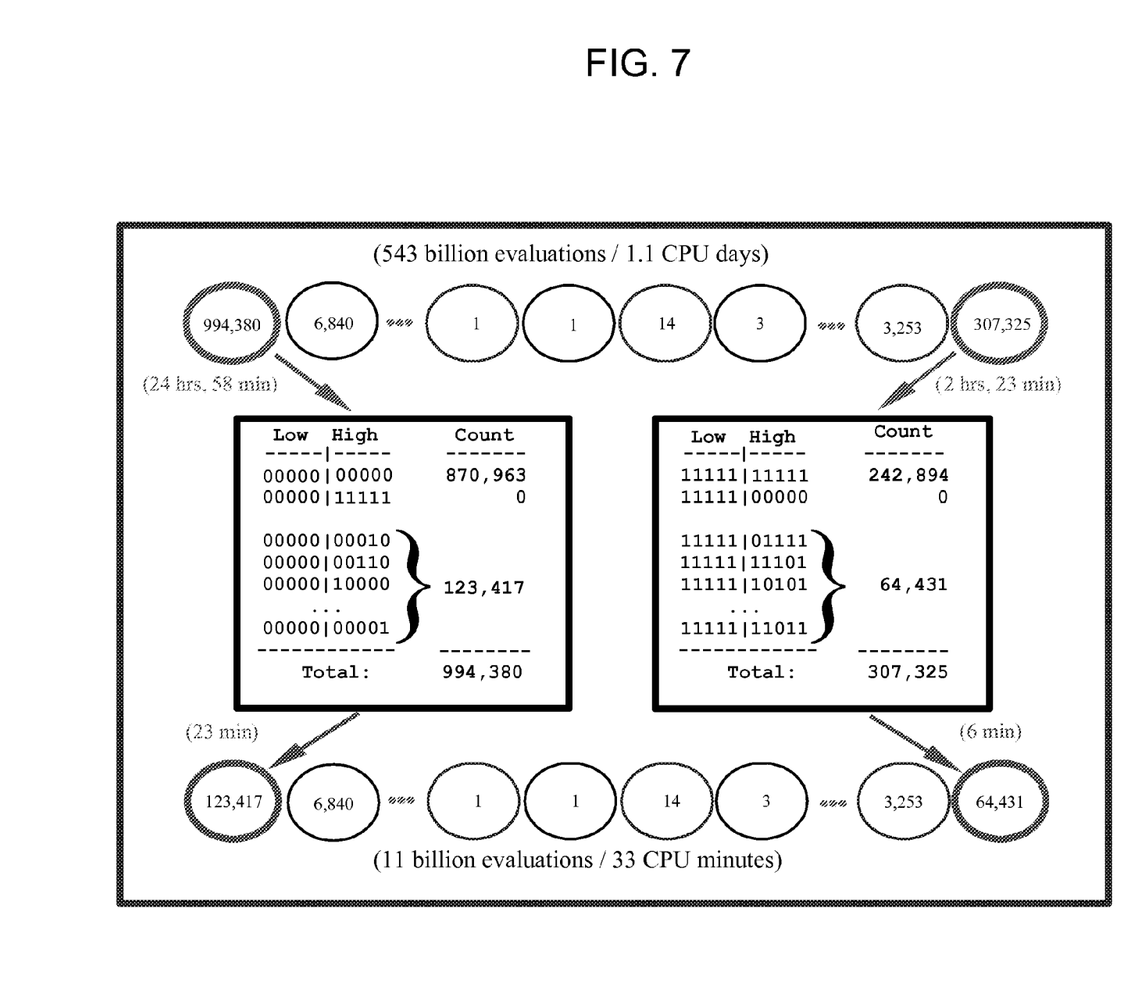
FIG. 7 shows an illustrative example of determining that no bridging defect involves a constant-state node by using state-count subsets rather than explicit evaluation of node pairs according to one embodiment of the invention.

FIG. 7 shows an illustrative example of the operation of step S5-2 on two of the sets generated in step S3 (as shown in FIG. 6). Please note, in the example shown in FIG. 7, step S5-2 is performed on the two largest sets determined in step S3, which contain those nodes that remained at a single logic state for all low-current vectors. As shown in FIG. 7, among the 994,380 nodes of the left-most set, 870,963 are in constant-state "0" and none is in constant-state "1". In this case, all the 870,963 constant-state "0" nodes can be filtered out because it is impossible for them to be bridged to any other nodes. As a consequence, there are only 123,417 nodes left in the left-most set. Similarly, the 242,894 constant-state "1" nodes of the right-most set can be filtered out because there is no constant-state "0" node in that set to be bridged to them, which results in 64,431 nodes left in the right-most set. For this specific example, step S5-2 reduces the CPU time projected for explicit evaluation of the remaining node pairs from approximately 27 hours to just over half an hour.

Because of the large number of nodes that typically remain at one logic state during all test vectors, constant-state node filtering has the greatest effect in reducing CPU time when applied to these sets of nodes. As shown in FIG. 7 and according to an alternative embodiment, step S5-2 may be applied only to the nodes that have the same logic states for all vectors (no matter low-current and high-current).

Figure 8:
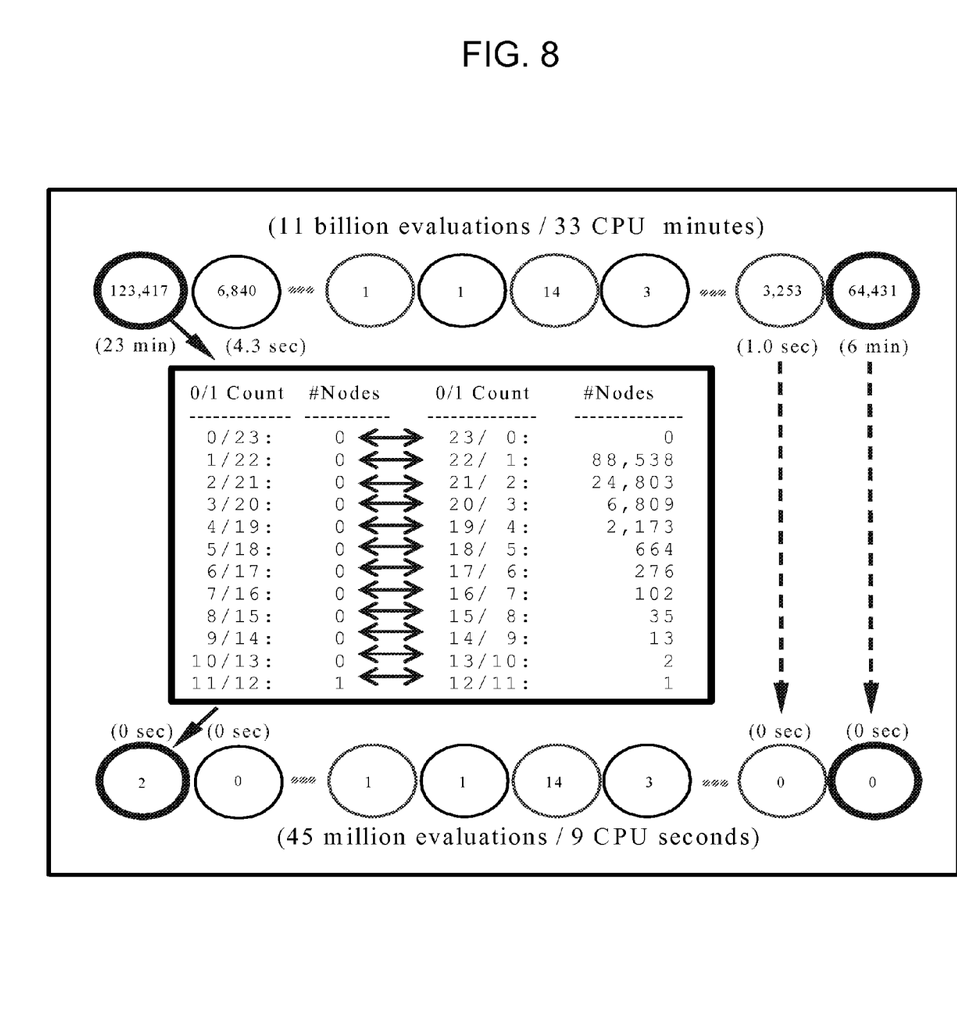
FIG. 8 shows an illustrative example of the use of state-count subsets to quickly reduce the number of node pairs requiring explicit evaluation according to one embodiment of the invention.

In step S5-3, complementary pair identifier 145 determines complementary pairs of nodes from the subsets with complementary state counts. FIG. 8 shows an illustrative example of the operation of step S5-3 on the leftmost set that was operated on during step S5-2. For the example shown in FIG. 8, there are 23 high-current vectors in total. As such, there are 24 state-count subsets (several of which are empty) and thus 12 pairs of subsets whose members have complementary state counts. For example, any node in the subset of nodes that were at logical "0" once and at logical "1" 22 times on the 23 high-current vectors (indicated in the figure with "1/22") need be evaluated against only members of the subset of nodes that were at logical "0" 22 times and at logical "1" once ("22/1"). Although the latter subset contains 88,538 nodes, the former subset is empty; thus all of the nodes in the latter subset can be eliminated from consideration without further analysis. As shown by the example of FIG. 8, at least one of each pair of subsets with complementary state counts is empty, with the exception of subsets 11/12 and 12/11, each of which contain only a single node. Thus, of the 123,417 nodes in this set, only one complementary pair of nodes exists. All other nodes can be filtered out, which substantially saves computation resources.

As described before, node logic states are not limited to the binary values "0" and "1", but may include other states such as a floating state or an unknown state (logical "X"). Complementary pair identifier 145 could still function substantially as described above, but would need to take extra measures to accommodate non-binary states. For example, because a bridge between two nodes will not cause additional $I_{DDQ}$ when one or both nodes are floating, complementary pair identifier 145 could discard any node found to be at a floating state under a high-current vector instead of assigning it to a state-count subset. A logical "X" could be treated as logical "0" or "1" to favor the constitution of a complementary pair. It should be appreciated that the current invention is not limited by the specific methods used to accommodate non-binary node states.

Next in step S6, node pair evaluator 150 determines whether a bridging defect exists between the determined complementary pair of nodes. According to the example of FIG. 8, among the 123,417 nodes in the set, node pair evaluator 150 needs to consider only a single pair of complementary nodes. The process described above starting with step S4 is performed for every set of nodes produced in step S3.

Any now available or future developed methods may be used in making the determination of step S6 and all are included in the current invention. As steps S3 and S5 generate only a relatively small number of node pairs to be operated on in step S6, the consumption of system resources is substantially reduced even using the currently available $I_{DDQ}$ model diagnosis. In addition, step S6 may also include determining whether two nodes that satisfy the $I_{DDQ}$ bridge fault model are physically proximate to each other by, e.g., a physical examination of the IC chip, which may further reduce the number of nodes diagnosed. Any now available or future developed methods may be used in the physical examination, and all are included in the current invention. For example, node pair evaluator 150 may instruct a user to perform the physical examination. In addition, node pair evaluator 150 may control an automatic mechanism to obtain an image of the IC, and to examine whether two nodes determined to satisfy the $I_{DDQ}$ bridge fault model are physically proximate to each other. In addition, after all sets of nodes have been processed, the operation of bridging defect diagnostic system 132 may go back to step S2 to reiterate the process based on another threshold to categorize $I_{DDQ}$, as described above.

4. Conclusion

While shown and described herein as a method and system for diagnosing a bridging defect in an integrated circuit, it is understood that the invention further provides various alternative embodiments. For example, in one embodiment, the invention provides a program product stored on a computer-readable medium, which when executed, enables a computer infrastructure to diagnose a bridging defect in an integrated circuit. To this extent, the computer-readable medium includes program code, such as bridging defect diagnostic system 132 (FIG. 2), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 2) and/or database 128 (FIG. 2), and/or as a data signal traveling over a network (e.g., during a wired/wireless electronic distribution of the program product).

In another embodiment, the invention provides a method of generating a system for diagnosing a bridging defect in an integrated circuit. In this case, a computer infrastructure, such as computer system 100 (FIG. 2), can be obtained (e.g., created, maintained, having been made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 2), from a computer-readable medium; (2) adding one or more computing devices to the computer infrastructure; and (3) incorporating and/or modifying one or more existing systems of the computer infrastructure to enable the computer infrastructure to perform the process steps of the invention.

In still another embodiment, the invention provides a business method that performs the process described herein on a subscription, advertising supported, and/or fee basis. That is, a service provider could offer to diagnose a bridging defect in an integrated circuit as described herein. In this case, the service provider can manage (e.g., create, maintain, support, etc.) a computer infrastructure, such as computer system 100 (FIG. 2), that performs the process described herein for one or more customers and communicates the results to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method for diagnosing a bridging defect in an integrated circuit including multiple nodes, the method comprising:

obtaining quiescent power supply current ($I_{DDQ}$) measurements of the integrated circuit under multiple test vectors;

categorizing each of the obtained $I_{DDQ}$ measurements as one of a defect value and a non-defect value;

obtaining a logic state of each of the multiple nodes under each of the multiple test vectors;

determining whether two of the multiple nodes constitute a complementary pair of nodes; and diagnosing whether a bridging defect exists between the determined complementary pair of nodes.

2. The method of claim 1, further comprising determining whether two of the multiple nodes are at a same logic state under a test vector that yield an $I_{DDQ}$ measurement of the non-defect value.

3. The method of claim 2, wherein the complementary pair determining is only performed on nodes that are at the same logic state under all test vectors that yield an $I_{DDQ}$ measurement of the non-defect value.

4. The method of claim 1, wherein the complementary pair determining first determines a complementary pair for a node that is at a same logic state under all the test vectors that yield $I_{DDQ}$ measurements of the defect value.

5. The method of claim 1, further comprising partitioning the multiple nodes into sub-groups based on the obtained logic states of the multiple nodes under test vectors that yield $I_{DDQ}$ measurements of the non-defect value.

6. The method of claim 1, wherein the diagnosing includes determining whether logic states of the two nodes of the complementary pair are opposite to each other under each of test vectors that yield $I_{DDQ}$ measurements of the defect value.

7. The method of claim 1, wherein the diagnosing includes determining whether the two nodes of the complementary pair are physically proximate to each other.

8. A system for diagnosing a bridging defect in an integrated circuit including multiple nodes, the system comprising:
- means for measuring quiescent power supply current ($I_{DDQ}$) of the integrated circuit under multiple test vectors;
- means for categorizing each of the obtained $I_{DDQ}$ measurements as one of a defect value and a non-defect value;
- means for obtaining a logic state of each of the multiple nodes under each of the multiple test vectors;
- means for determining whether two of the multiple nodes constitute a complementary pair of nodes; and
- means for diagnosing whether a bridging defect exists between the determined complementary pair of nodes.

9. The system of claim 8, further comprising means for determining whether two of the multiple nodes are at a same logic state under a test vector that yield an $I_{DDQ}$ measurement of the non-defect value.

10. The system of claim 9, wherein the complementary pair determining means determines a complementary pair only among nodes that are at the same logic state under all test vectors that yield an $I_{DDQ}$ measurement of the non-defect value.

11. The system of claim 8, wherein the complementary pair determining means determines a complementary pair for a node that is at a same logic state under all the test vectors that yield $I_{DDQ}$ measurements of the defect value.

12. The system of claim 8, further comprising means for partitioning the multiple nodes into sub-groups based on the obtained logic states of the multiple nodes under test vectors that yield $I_{DDQ}$ measurements of the non-defect value.

13. The system of claim 8, wherein the diagnosing means determines whether logic states of the two nodes of the complementary pair are opposite to each other under each of test vectors that yield $I_{DDQ}$ measurements of the defect value.

14. The system of claim 8, wherein the diagnosing means controls determining whether the two nodes of the complementary pair are physically proximate to each other.

15. A computer program product for diagnosing a bridging defect in an integrated circuit including multiple nodes, the computer program product comprising:
- computer usable program code configured to:
  - obtain quiescent power supply current ($I_{DDQ}$) measurements of the integrated circuit under multiple test vectors;
  - categorize each of the obtained $I_{DDQ}$ measurements as one of a defect value and a non-defect value;
  - obtain a logic state of each of the multiple nodes under each of the multiple test vectors;
  - determine whether two of the multiple nodes constitute a complementary pair of nodes; and
  - diagnose whether a bridging defect exists between the determined complementary pair of nodes.

16. The program product of claim 15, wherein the program code is further configured to determine whether two of the multiple nodes are at a same logic state under a test vector that yield an $I_{DDQ}$ measurement of the non-defect value.

17. The program product of claim 16, wherein the program code is further configured to determine a complementary pair only among nodes that are at the same logic state under all test vectors that yield an $I_{DDQ}$ measurement of the non-defect value.

18. The program product of claim 15, wherein the program code is further configured to determine a complementary pair for a node that is at a same logic state under all the test vectors that yield $I_{DDQ}$ measurements of the defect value before determining a complementary pair for other nodes.

19. The program product of claim 15, wherein the program code is further configured to partition the multiple nodes into sub-groups based on the obtained logic states of the multiple nodes under test vectors that yield $I_{DDQ}$ measurements of the non-defect value.

20. The program product of claim 15, wherein the program code is further configured to determine whether logic states of the two nodes of the complementary pair are opposite to each other under each of test vectors that yield $I_{DDQ}$ measurements of the defect value.

21. The program product of claim 15, wherein the program code is further configured to control determining whether the two nodes of the complementary pair are physically proximate to each other.

22. A method of generating a system for diagnosing a bridging defect in an integrated circuit including multiple nodes, the method comprising: providing a computer infrastructure operable to:
- obtain quiescent power supply current ($I_{DDQ}$) measurements of the integrated circuit under multiple test vectors;
- categorize each of the obtained $I_{DDQ}$ measurements as one of a defect value and a non-defect value;
- obtain a logic state of each of the multiple nodes under each of the multiple test vectors;
- determine whether two of the multiple nodes constitute a complementary pair of nodes; and
- diagnose whether a bridging defect exists between the determined complementary pair of nodes.

23. The method of claim 22, wherein the computer infrastructure is further operable to determine whether two of the multiple nodes are at a same logic state under a test vector that yield an $I_{DDQ}$ measurement of the non-defect value.

24. The method of claim 23, wherein the computer infrastructure is further operable to determine a complementary pair only among nodes that are at the same logic state under all test vectors that yield an $I_{DDQ}$ measurement of the non-defect value.

25. The method of claim 22, wherein the computer infrastructure is further operable to determine a complementary pair for a node that is at a same logic state under all the test vectors that yield $I_{DDQ}$ measurements of the defect value before determining a complementary pair for other nodes.

26. The method of claim 22, wherein the computer infrastructure is further operable to partition the multiple nodes into sub-groups based on the obtained logic states of the multiple nodes under test vectors that yield $I_{DDQ}$ measurements of the non-defect value.

27. The method of claim 22, wherein the computer infrastructure is further operable to determine whether logic states of the two nodes of the complementary pair are opposite to each other under each of test vectors that yield $I_{DDQ}$ measurements of the defect value.

28. The method of claim 22, wherein the computer infrastructure is further operable to control determining whether the two nodes of the complementary pair are physically proximate to each other.

* * * * *